United States Patent [19]

Borrello

[11] Patent Number: 5,285,098
[45] Date of Patent: Feb. 8, 1994

[54] STRUCTURE AND METHOD INTERNAL PHOTOEMISSION DETECTION

[75] Inventor: Sebastian R. Borrello, Dallas, Tex.

[73] Assignee: Texas Instruments Incorporated, Dallas, Tex.

[21] Appl. No.: 877,433

[22] Filed: Apr. 30, 1992

[51] Int. Cl.$^5$ .................... H01L 29/44; H01L 29/48; H01L 31/06

[52] U.S. Cl. .................................. 257/466; 257/436; 257/455; 257/457; 257/448; 257/449

[58] Field of Search ............... 257/466, 457, 455, 448, 257/449, 435

[56] References Cited

U.S. PATENT DOCUMENTS

| | | | |
|---|---|---|---|
| 3,963,926 | 6/1976 | Borrello | 250/338 |
| 4,875,084 | 10/1989 | Tohyama | 257/451 |
| 4,876,586 | 10/1989 | Dyck | 257/466 |
| 4,939,561 | 7/1990 | Yamaka et al. | 257/455 |

OTHER PUBLICATIONS

Bor-Yeu Tsaur, C. K. Chen and John-Paul Mattia, PtSi Schottky-Barrier Focal Plane Arrays for Multispectral Imaging in Ultraviolet, Visible and Infrared Spectral Bands, IEEE Electron Device Letters, vol. 11, No. 4, Apr. 1990.

Bor-Yeu Tsaur, M. M. Weeks, R. Trubiano, P. W. Pellegrini and T. -R. Yew, IrSi Schottky-Barrier Infrared Detectors with 10 $\mu$m Cutoff Wavelength, IEEE Electron Device Letters, vol. 9, No. 12, Dec. 1988.

Bor-Yeu Tsaur, M. M. Weeks, and P. W. Pellegrini, Pt-Ir Silicide Schottky-Barrier IR Detectors, IEEE Electron Device Letters, vol. 9, No. 2, Feb. 1988.

Bor-Yeu Tsaur, C. K. Chen and S. A. Marino, Long-Wavelength Ge$_x$Si$_{1-x}$/Si Heterojunction Infrared Detectors and 400x400-Element Imager Arrays, IEEE Electron Device Letters, vol. 12, No. 6, Jun. 1991.

Bor-Yeu Tsaur, M. J. McNutt, R. A. Bredthauer and R. B. Mattson, 128x128-Element IrSi Schottky-Barrier Focal Plane Arrays for Long-Wavelength Infrared Imaging, IEEE Electron Device Letters, vol. 10, No. 8, Aug. 1989.

Primary Examiner—Jerome Jackson
Attorney, Agent, or Firm—Richard A. Stoltz; James C. Kesterson; Richard L. Donaldson

[57] ABSTRACT

A method and structure are provided for internal photoemission detection. At least one groove (30a) is formed in a side of a semiconductor layer (32). A silicide film (58) is formed in each groove (30a) over the semiconductor layer (32). A metal contact region (44) is electrically coupled to the silicide film (58) such that a voltage at the metal contact region (44) indicates an intensity of radiation incident on the structure (28).

25 Claims, 2 Drawing Sheets

STRUCTURE AND METHOD INTERNAL PHOTOEMISSION DETECTION

TECHNICAL FIELD OF THE INVENTION

This invention relates in general to integrated circuits, and in particular to a method and structure for internal photoemission detection.

BACKGROUND OF THE INVENTION

A typical low activation energy Schottky-barrier diode is formed by depositing a metal film on a silicon substrate and then annealing to convert the metal film to a corresponding silicide by reaction with the silicon substrate. The detection of radiation by a silicide Schottky-barrier diode is based on internal photoemission at the interface between the thin silicide film and the silicon substrate. Such a silicide Schottky-barrier photoemission detector can operate in either a front-illumination mode or a back-illumination mode.

In the front-illumination mode, radiation is incident on the silicide film. In the back-illumination mode, radiation is incident on the surface of the silicon substrate opposite the silicide film. The silicon substrate absorbs photons having energies higher than the bandgap of silicon. However, the silicon substrate fails to absorb photons having energies lower than the bandgap of silicon. Instead, such low-energy photons are transmitted through the silicon substrate and absorbed in the silicide film.

After being absorbed in the silicide film, the low-energy photons produce electron-hole pairs. A percentage of the electrons have energies above an electrical barrier height at the silicide/silicon interface, so that a photocurrent is generated when such electrons are injected into the silicon. Such a photocurrent is variable in that the amount of photocurrent depends upon the intensity of radiation incident on the photoemission detector.

Quantum efficiency is a ratio between the amount of incident radiation and the resulting amount of photocurrent. A typical internal photoemission detector has a maximum quantum efficiency on the order of 1%, occurring at wavelengths in the near visible light range. As wavelength increases into the infrared ("IR") range, quantum efficiency steadily drops below 1% until the photoemission detector eventually reaches a cutoff wavelength. At the cutoff wavelength, quantum efficiency is insufficient for the photoemission detector to generate sufficient photocurrent for detecting infrared radiation.

For example, a typical $Ge_xSi_{1-x}/Si$ photoemission detector has a cutoff wavelength of approximately 12 $\mu m$. It is desirable to efficiently detect radiation at between 8 and 12 $\mu m$ wavelengths. If a photoemission detector's quantum efficiency increased, then the photoemission detector would generate sufficient photocurrent to readily detect low intensity infrared radiation.

Therefore, if quantum efficiency increased, then objects would be more easily detected and imaged. For example, at room temperature of approximately 300 degrees Kelvin, objects emit large numbers of photons at wavelengths of approximately 10 $\mu m$. However, at 10 $\mu m$, a typical photoemission detector has low quantum efficiency on the order of 0.1%, such that relatively little photocurrent is generated in response to radiation from room temperature objects.

Although a typical photoemission detector's quantum efficiency increases as wavelength decreases below 10 $\mu m$, room temperature objects emit fewer photons as wavelength decreases below 10 $\mu m$. Accordingly, motion detection and imaging of room temperature objects is difficult to achieve with typical photoemission detectors. If quantum efficiency increased, then room temperature objects would be more easily detected and imaged, because more photocurrent would be generated in response to the photons emitted from room temperature objects at wavelengths of approximately 10 $\mu m$.

Further, if quantum efficiency increased, the ratio would increase between a photocurrent signal and noise current. For example, the temperature of a photoemission detector itself might cause thermal excitation, resulting in noise current even in the absence of significant radiation incident on the silicide film. If total current has a small component of photocurrent signal and a large component of noise current, then it is difficult to detect the photocurrent signal resulting from incident photons.

Due to its small quantum efficiency, a typical photoemission detector generates relatively little photocurrent signal. Accordingly, a typical photoemission detector is cooled to low temperatures so that noise current is reduced, thereby achieving an acceptable ratio between the photocurrent signal and the noise current. However, readout circuitry associated with the photoemission detector might fail to efficiently operate at such low temperatures. If quantum efficiency increased, then less cooling would be necessary to achieve the acceptable ratio between the photocurrent signal and the noise current. By reducing the necessary cooling, operating overhead would be reduced, and the photoemission detector would operate in a wider range of environments.

Accordingly, a need has arisen for a method and structure for internal photoemission detection, in which quantum efficiency of photoemission detection is increased relative to previous techniques.

SUMMARY OF THE INVENTION

In a method and structure for internal photoemission detection, at least one groove is formed in a side of a semiconductor layer. A silicide film is formed in each groove over the semiconductor layer. A metal contact region is electrically coupled to the silicide film such that a voltage at the metal contact region indicates an intensity of radiation incident on the structure.

It is a technical advantage of the present invention that quantum efficiency of photoemission detection is increased relative to previous techniques.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-4 of the drawings, like numerals being used for like and corresponding parts of the various drawings.

Figure 1:
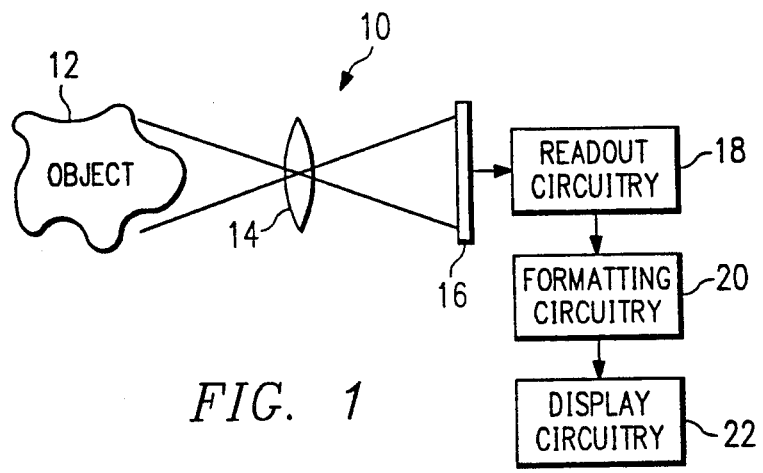
FIG. 1 is a block diagram of a system for photoemission detection of the preferred embodiment.

FIG. 1 is a block diagram of a system, indicated generally at 10, for photoemission detection of the preferred embodiment. An object 12 emits radiation. A lens 14 directs radiation from object 12 to be incident on an array 16 of photoemission detectors. The array may consist of over 100,000 detectors. Each photoemission detector of array 16 includes the structure for internal photoemission detection of the preferred embodiment, described further hereinbelow in connection with FIGS. 2 and 4. Each photoemission detector of array 16 generates a photocurrent in response to radiation from object 12.

Readout circuitry 18 is connected to array 16. In response to the photocurrents generated by photoemission detectors of array 16, readout circuitry 18 outputs voltage signals indicating intensities of radiation detected by photoemission detectors of array 16. The voltage signals are output from readout circuitry 18 to formatting circuitry 20.

Formatting circuitry 20 inputs the voltage signals from readout circuitry 18 and outputs image data indicating an image of object 12. The image data are output from formatting circuitry 20 to display circuitry 22. Display circuitry 22 inputs the image data and displays the image of object 12.

Figure 2:
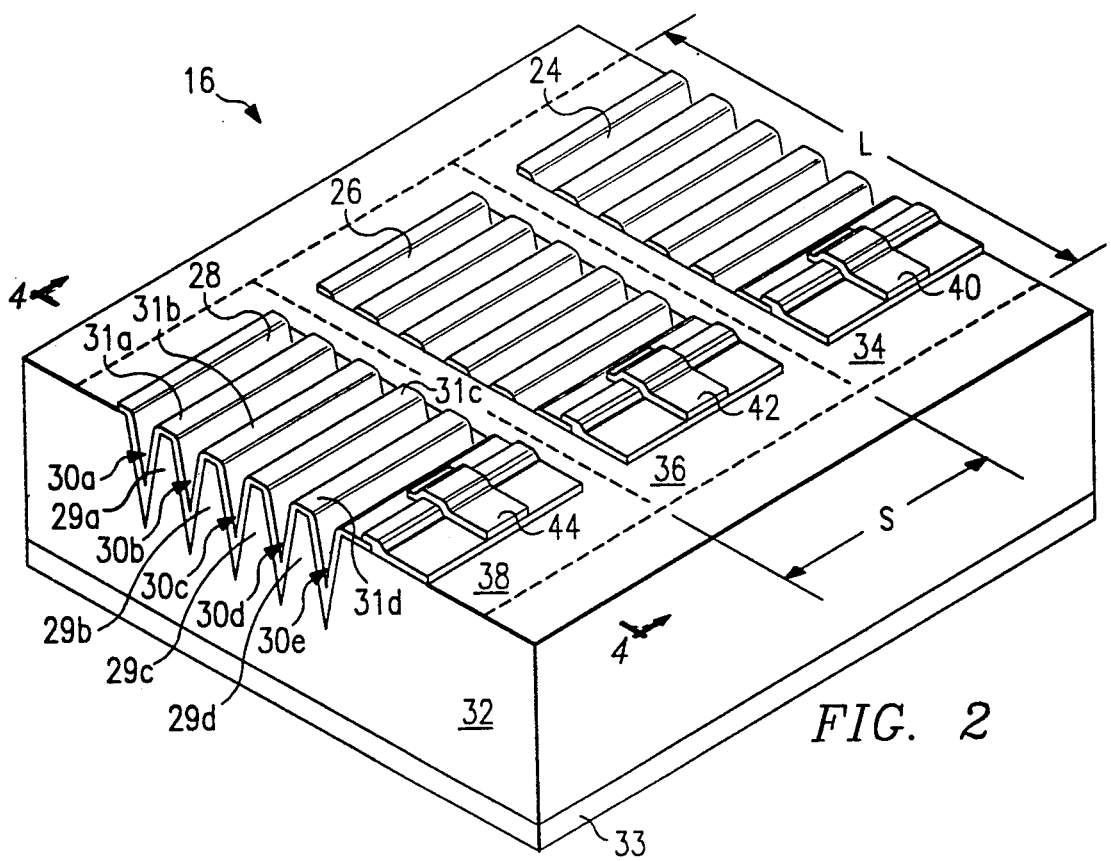
FIG. 2 is a perspective view of a section of an array of photoemission detectors of the system of FIG. 1, including the structure for internal photoemission detection of the preferred embodiment.

FIG. 2 is a perspective view of a section of array 16 including structures 24, 26 and 28 for internal photoemission detection. For clarity, structures 24 and 28 are shown partially in a cutaway view. Structure 28 is a representative internal photoemission detection structure. Walls 29a–d of structure 28 are formed by orientation dependent etching ("ODE") grooves 30a–e in the front side of a conventional doped p-type silicon semiconductor substrate layer 32 having (100) orientation and a resistivity between 20 to 40 ohms-cm. Walls 29a–d have top ledges 31a–d, respectively. Using ODE technology, etching of substrate 32 is faster in certain directions based upon the crystallographic orientation of substrate 32, such that grooves 30a–e are formed without significant undercut. Sizes of grooves 30a–e are described further hereinbelow in connection with FIG. 4.

A back side of substrate 32 is covered by an antireflection coating 33. In the preferred embodiment, array 16 operates in the back-illumination mode, although array 16 is further able to operate in the front-illumination mode. Structures 24, 26 and 28 are located in cells 34, 36 and 38, respectively. Each of cells 34, 36 and 38 has a width S and a length L. In the preferred embodiment, S equals approximately 50 micrometers, and L equals approximately 70 micrometers. Smaller sizes are feasible.

Structures 24, 26 and 28 respectively include aluminum metal contact pads 40, 42 and 44, for interconnection to readout circuitry 18 as described further hereinbelow i connection with FIG. 3. Each of pads 40, 42 and 44 has a voltage relative to a voltage reference node (not shown) connected to substrate 32. Pad 44 is a representative pad. A voltage at pad 44 is proportional to a variable photocurrent generated in response to the intensity of radiation incident on structure 28.

Figure 3:
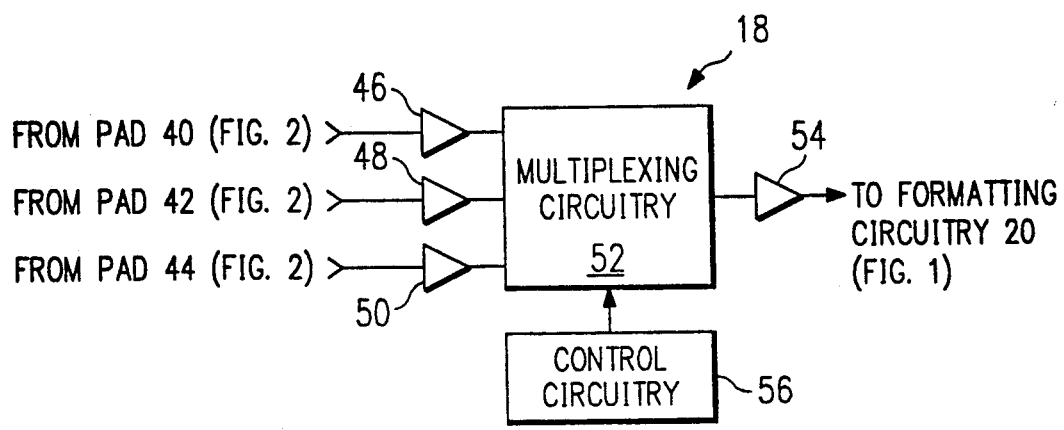
FIG. 3 is a block diagram of readout circuitry of the system of FIG. 1.

FIG. 3 is a block diagram of readout circuitry 18. In the preferred embodiment, readout circuitry 18 is monolithically integrated with substrate 32 using metal-oxide semiconductor ("MOS") technology. Alternatively, readout circuitry 18 can be monolithically integrated with substrate 32 using charge-coupled device ("CCD") technology. With monolithic construction, large uniform focal plane arrays can be manufactured to operate in the staring mode.

A buffer/amplifier 46 of FIG. 3 is connected to pad 40 in cell 34 of FIG. 2. A buffer/amplifier 48 is connected to pad 42 in cell 36 of FIG. 2, and a buffer/amplifier 50 is connected to pad 44 in cell 38 of FIG. 2. Buffer/amplifiers 46, 48 and 50 buffer and amplify voltages at pads 40, 42 and 44, respectively.

Multiplexing circuitry 52 is coupled between an output buffer 54 and buffer/amplifiers 46, 48 and 50. Multiplexing circuitry 52 selectively connects one of buffer/amplifiers 46, 48 and 50 to output buffer 54, as directed by control circuitry 56. The voltage output from the selectively connected buffer/amplifier is output through output buffer 54 to formatting circuitry 20 of FIG. 1. Control circuitry 56 directs multiplexing circuitry 52 to selectively connect a repeating sequence of buffer/amplifiers 46, 48 and 50 to output buffer 54, so that voltages from buffer/amplifiers 46, 48 and 50 are sequentially and repeatedly output through output buffer 54 to formatting circuitry 20. In this manner, the intensities of radiation detected by structures 24, 26 and 28 are sequentially and repeatedly indicated to formatting circuitry 20.

Figure 4:
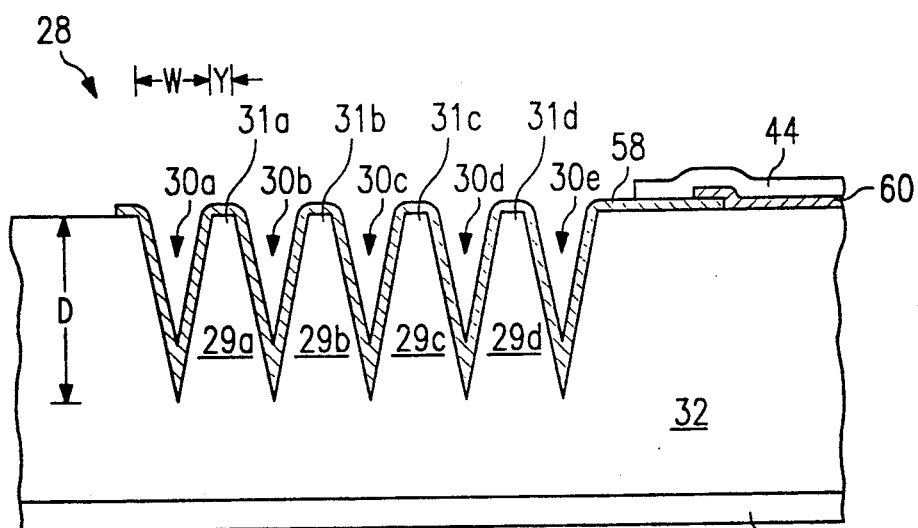
FIG. 4 is a cross-sectional view of the structure for internal photoemission detection of the preferred embodiment.

FIG. 4 is a cross-sectional view of structure 28 from the perspective indicated in FIG. 2. After readout circuitry 18 is integrated with substrate 32, a silicide film 58 is formed over walls 29a–d of substrate 32. Accordingly, as shown in FIG. 4, silicide film 58 is formed in grooves 30a–e and over ledges 31a–d between grooves 30a–e. The preferred embodiment uses RF plasma deposition technology to deposit the silicide material while heating the integrated circuit.

Silicide film 58 can be any silicide film suitable for photodetection, such as PtSi film, IrSi film, or $Ge_x$-$Si_{1-x}$/Si film. In the preferred embodiment, silicide film 58 is a $Ge_xSi_{1-x}$/Si film, where an exemplary value of $x$ is 0.22, 0.33, 0.42 or 0.44. A heavily doped p type $Ge_xSi_{1-x}$ epitaxial layer having a thickness of 15–40 nm is fabricated on substrate 32. The GeSi layer is grown at a substrate temperature of 500° C. by coevaporation of Ge and Si sources in a molecular beam epitaxy system. The GeSi layer is doped with boron to a concentration of $\sim 1 \times 10^{20}$ cm$^{-3}$ by coevaporation of an $HBO_2$ source. Infrared radiation incident on the back side of substrate 32 is absorbed in the $Ge_xSi_{1-x}$/Si film by free-carrier absorption, resulting in photoexcited Carriers.

A silicon dioxide insulator layer 60 is deposited on substrate 32 as shown in FIG. 4, such that insulator layer 60 is partially disposed over silicide film 58. Aluminum metal pad 44 is deposited as shown in FIG. 4, such that insulator layer 60 is interposed between pad 44 and substrate 32, and such that pad 44 contacts an exposed region of silicide film 58.

Each of walls 29a–d and grooves 30a–e has a depth D. Moreover, each of grooves 30a–e has a width W. In the preferred embodiment, W is proportional to a wavelength of radiation to be detected, in order to increase the likelihood of absorption in silicide film 58 due to a resonance cavity effect from reflections in grooves 30a-e. D is proportional to W, and it is preferable for the ratio between D and W to be as high as possible. Using sub-micron CMOS technology, it is possible for the ratio between D and W to be higher than 50 to 1. In an exemplary embodiment where W is approximately 5 micrometers, D can be approximately 40 micrometers to more than 250 micrometers. In the preferred embodiment, a distance Y across each ledge between adjacent grooves, such as ledge 29a between adjacent grooves 30a and 30b, is approximately 1 micrometer.

For photons with energies less than the optical barrier height $\psi$ of a photoemission detection structure, the quantum efficiency $\eta$ is zero. For photons with energies exceeding $\psi$, $\eta$ is related to the wavelength $\lambda$ according to $$\eta(\lambda) = C_1 \eta'(\lambda)$$

where $C_1$ is the wavelength-independent emission coefficient (in $eV^{-1}$) measuring the efficiency of the internal photoemission process, and where $$\eta'(eV) = (1.2/\lambda(\eta m))(1 - \psi(eV)\lambda(\eta m)/1.24)^2.$$

Accordingly, $C_1 = \eta/\eta'$.

The value of $C_1$ for a photoemission detection structure can be computed as n/N, where n is the measured number of electrons collected in response to a specified incident background radiation, and where N is the calculated number of electrons if quantum efficiency equals $\eta'$.

The optical barrier height $\psi$ can be determined independently using data for the dependence of $\eta$ on the photon energy $h\nu$. For values of $h\nu$ extending over a limited range above $\psi$, $\eta$ of a photoemission detection structure is given approximately by a modified Fowler equation:

$$\eta = C_1 \frac{(h\nu - \psi)^2}{h\nu}$$

Accordingly, a plot of $(\eta h\nu)^{\frac{1}{2}}$ versus $h\nu$ results in a straight line having a slope $(C_1)^{\frac{1}{2}}$ and intercepting the $h\nu$ axis at $\psi$. The cutoff wavelength is defined as $\lambda_c \equiv 1.24/\psi$.

Typical PtSi, IrSi and $Ge_xSi_{1-x}$/Si detectors have a quantum efficiency below 0.1% in the infrared range, resulting from their small silicide absorption layers. For efficient collection, the absorption of photons in the PtSi, IrSi or $Ge_xSi_{1-x}$ typically must be near the barrier between the silicon substrate and the silicide. Accordingly, effective absorption occurs within 50 Angstroms of the barrier.

In an important aspect of the preferred embodiment, structures 24, 26 and 28 are fabricated with orientation dependent etched silicon, so that the effective absorption length is increased by a factor of approximately (2D)/W relative to previous techniques. By increasing the effective absorption length, quantum efficiency can be improved to above 10% in the long wavelength infrared ("LWIR") region.

Structures 24, 26 and 28 can be customized for optimum absorption at a desired wavelength. The effective absorption thickness can be customized by controlled etching of the groves such as grooves 30a-d of structure 28. The resonance cavity effect can be enhanced by suitably establishing the sizes of grooves 30a-e for resonant infrared detection. Efficiency might be further increased by adjusting thickness of the $Ge_xSi_{1-x}$/Si layer and increasing free-carrier absorption by higher boron doping.

Although the present invention and its advantages have been described in detail, it should be understood that various changes, substitutions and alterations can be made herein without departing from the spirit and scope of the invention as defined by the appended claims.

What is claimed is:

1. A structure for internal photoemission detection, comprising:
   a semiconductor layer having front and back sides, said front side having at least one groove formed therein, wherein said groove has a depth to width ratio of at least eight to one;
   a silicide film formed in each said groove over said semiconductor layer; and
   a metal contact region electrically coupled to said silicide film such that a voltage at said metal contact region indicates an intensity of radiation incident on the structure.

2. The structure of claim 1 wherein each said groove is orientation dependent etched in said semiconductor layer.

3. The structure of claim 1 wherein said metal contact region includes aluminum metal.

4. The structure of claim 1 wherein said semiconductor layer is a p-type silicon semiconductor substrate layer.

5. The structure of claim 1 and further comprising readout circuitry monolithically integrated with said semiconductor layer and electrically coupled to said metal contact region for outputting a signal in response to said voltage.

6. The structure of claim 1 wherein said silicide film is a PtSi film.

7. The structure of claim 1 wherein said silicide film is an IrSi film.

8. The structure of claim 1 wherein said silicide film is a $Ge_xSi_{1-x}$/Si film.

9. The structure of claim 1 wherein said back side of said semiconductor layer is covered by an antireflection coating.

10. The structure of claim 1 wherein a width of each said groove is proportional to a wavelength of radiation to be indicated.

11. An array of structures for internal photoemission detection, comprising:
    a silicon semiconductor layer including the structures, each structure having a plurality of orientation dependent etched grooves formed in a side of said semiconductor layer, wherein said groove has a depth to width ratio between eight to one and about 50 to 1, and each structure including:
    a silicide film formed in and between said grooves of the structure over said semiconductor layer;
    a metal contact region electrically coupled to said silicide film of the structure such that a voltage at said metal contact region indicates an intensity of radiation incident on the structure; and
    readout circuitry monolithically integrated with said semiconductor layer and electrically coupled to each said metal contact region for outputting at least one signal in response to said voltages.

12. The structure of claim 11 wherein each said metal contact region includes aluminum metal.

13. The structure of claim 11 wherein each said silicide film is a PtSi film.

14. The structure of claim 11 wherein each said silicide film is an IrSi film.

15. The structure of claim 11 wherein each said silicide film is a $Ge_xSi_{1-x}/Si$ film.

16. The structure of claim 11 wherein said side is a front side of said semiconductor layer, and wherein a back side of said semiconductor layer is covered by an antireflection coating.

17. The structure of claim 11 wherein a width of each said groove is proportional to a wavelength of radiation to be indicated.

18. A method of internal photoemission detection, comprising the steps of:
  forming at least one groove in a side of a semiconductor layer;
  forming a silicide film in each said groove over said semiconductor layer, wherein said groove has a depth to width ratio of at least eight to one; and
  electrically coupling a metal contact region to said silicide film such that a voltage at said metal contact region indicates an intensity of radiation incident on said silicide film.

19. The method of claim 18 wherein said forming step is performed by orientation dependent etching each said groove in said side of said semiconductor layer.

20. The method of claim 18 and further comprising the step of monolithically integrating readout circuitry with said semiconductor layer, said readout circuitry being electrically coupled to said metal contact region for outputting a signal in response to said voltage.

21. The method of claim 18 wherein said forming step is performed by forming a PtSi film in each said groove over said semiconductor layer.

22. The method of claim 18 wherein said forming step is performed by forming an IrSi film in each said groove over said semiconductor layer.

23. The method of claim 18 wherein said forming step is performed by forming a $Ge_xSi_{1-x}/Si$ film in each said groove over said semiconductor layer.

24. The method of claim 18 and further comprising the step of covering a back side of said semiconductor layer with an antireflection coating.

25. The method of claim 18 wherein said groove forming step includes the step of establishing a width of each said groove to be proportional to a wavelength of radiation to be indicated.

* * * * *